US011860036B2

United States Patent
Burdt et al.

(10) Patent No.: US 11,860,036 B2
(45) Date of Patent: Jan. 2, 2024

(54) DETERMINATION OF MEASUREMENT ERROR IN AN ETALON

(71) Applicant: Cymer, LLC, San Diego, CA (US)

(72) Inventors: Russell Allen Burdt, San Diego, CA (US); John Theodore Melchior, San Diego, CA (US); Kuo-Tai Teng, Poway, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 17/928,384

(22) PCT Filed: May 25, 2021

(86) PCT No.: PCT/US2021/034101
§ 371 (c)(1),
(2) Date: Nov. 29, 2022

(87) PCT Pub. No.: WO2021/262373
PCT Pub. Date: Dec. 30, 2021

(65) Prior Publication Data
US 2023/0142333 A1    May 11, 2023

Related U.S. Application Data

(60) Provisional application No. 63/043,312, filed on Jun. 24, 2020.

(51) Int. Cl.
*G01B 9/02055* (2022.01)
*G01J 3/28* (2006.01)
(Continued)

(52) U.S. Cl.
CPC ............ *G01J 3/28* (2013.01); *G01B 9/02074* (2013.01); *G01J 3/26* (2013.01); *G01J 9/0246* (2013.01); *G03F 7/70575* (2013.01)

(58) Field of Classification Search
CPC .................................................. G01B 9/02074
See application file for complete search history.

(56) References Cited

U.S. PATENT DOCUMENTS

| | | |
|---|---|---|
| 5,243,614 A | 9/1993 | Wakata et al. |
| 5,319,441 A | 6/1994 | Terada et al. |

(Continued)

FOREIGN PATENT DOCUMENTS

| | | |
|---|---|---|
| CN | 102057269 A | 5/2011 |
| EP | 0459494 A2 | 12/1991 |

(Continued)

OTHER PUBLICATIONS

European International Searching Authority, International Search Report and Written Dpinion, counterpart PCT Application No. PCT/US2021/034101, dated Sep. 20, 2021, 11 pages.

(Continued)

*Primary Examiner* — Hina F Ayub
(74) *Attorney, Agent, or Firm* — DiBerardino McGovern IP Group LLC

(57) ABSTRACT

Information relating to an etalon is accessed, the etalon being associated with a calibration parameter having a pre-set default value, the etalon being configured to produce an interference pattern including a plurality of fringes from a received light beam, and the information relating to the etalon including first spatial information related to a first fringe of the plurality of fringes and second spatial information related to a second fringe of the plurality of fringes. A first wavelength value of the received light beam is determined based on the spatial information related to the first fringe and an initial value of the calibration parameter. A second wavelength value of the received light beam is determined based on the spatial information related to the second fringe and the initial value of the calibration param- (Continued)

Figure 1A:
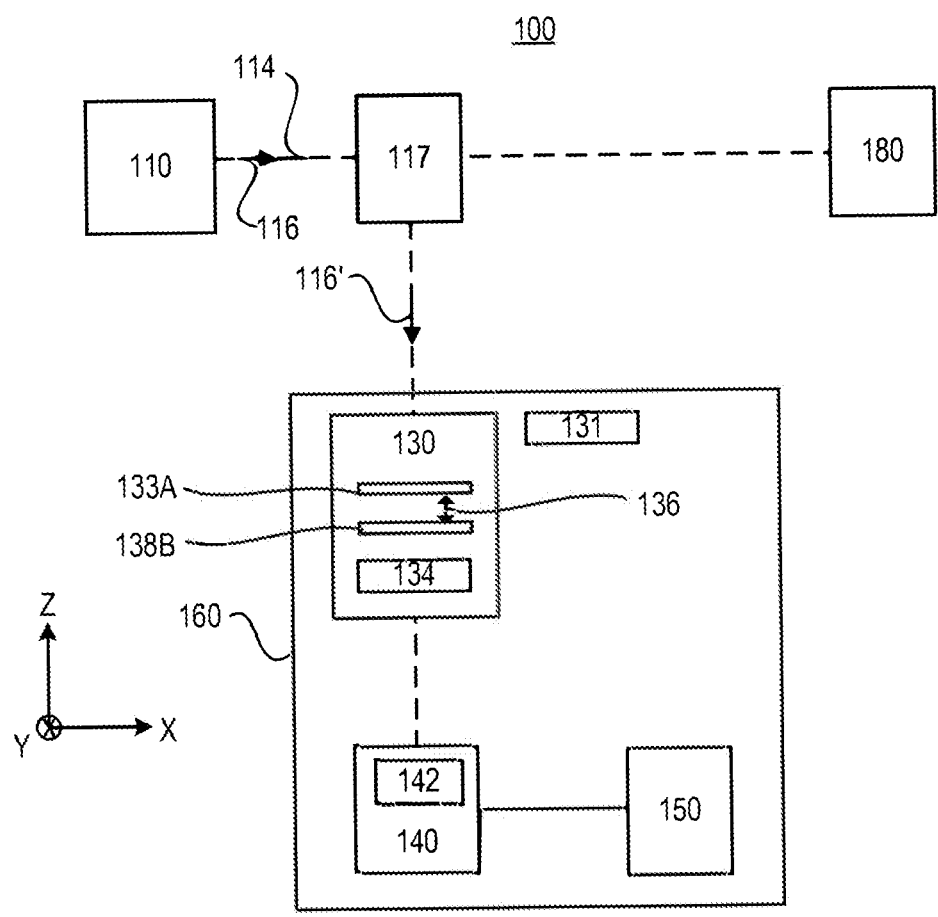

eter. The first wavelength value and the second wavelength value are compared to determine a measurement error value.

29 Claims, 12 Drawing Sheets

(51) Int. Cl.
*G01J 3/26* (2006.01)
*G01J 9/02* (2006.01)
*G03F 7/00* (2006.01)

(56) References Cited

U.S. PATENT DOCUMENTS

| | | | |
|---|---|---|---|
| 5,978,391 | A | 11/1999 | Das et al. |
| 5,978,394 | A | 11/1999 | Newman et al. |
| 6,317,448 | B1 | 11/2001 | Das et al. |
| 6,320,663 | B1 | 11/2001 | Ershov |
| 6,359,693 | B2 | 3/2002 | Smith et al. |
| 6,396,582 | B1 | 5/2002 | Buck et al. |
| 6,509,970 | B1 | 1/2003 | Seki et al. |
| 6,744,524 | B1 | 6/2004 | Kogan et al. |
| 7,161,681 | B2 | 1/2007 | Kuramoto |
| 7,196,796 | B2 | 3/2007 | Moriya et al. |
| 2003/0016363 | A1 | 1/2003 | Sandstrom et al. |
| 2003/0137672 | A1 | 7/2003 | Moriya et al. |
| 2013/0182259 | A1 | 7/2013 | Brezinski et al. |
| 2018/0149522 | A1 | 5/2018 | Zhao |

FOREIGN PATENT DOCUMENTS

| | | |
|---|---|---|
| JP | H04036622 A | 2/1992 |
| JP | H057031 A | 1/1993 |
| JP | 2001349781 A | 12/2001 |
| JP | 2003214958 A | 7/2003 |
| WO | 2010062853 A2 | 6/2010 |

OTHER PUBLICATIONS

Taiwan Intellectual Property Office, Office Action, counterpart Taiwan Application No. 112107753, dated Jul. 11, 2023, 8 pages (including 3 pages of English translation).

Japanese Patent Office, Office Action, counterpart Japanese Application No. 2022-574183, dated Sep. 13, 2023, 7 pages (including 4 pages of English translation).

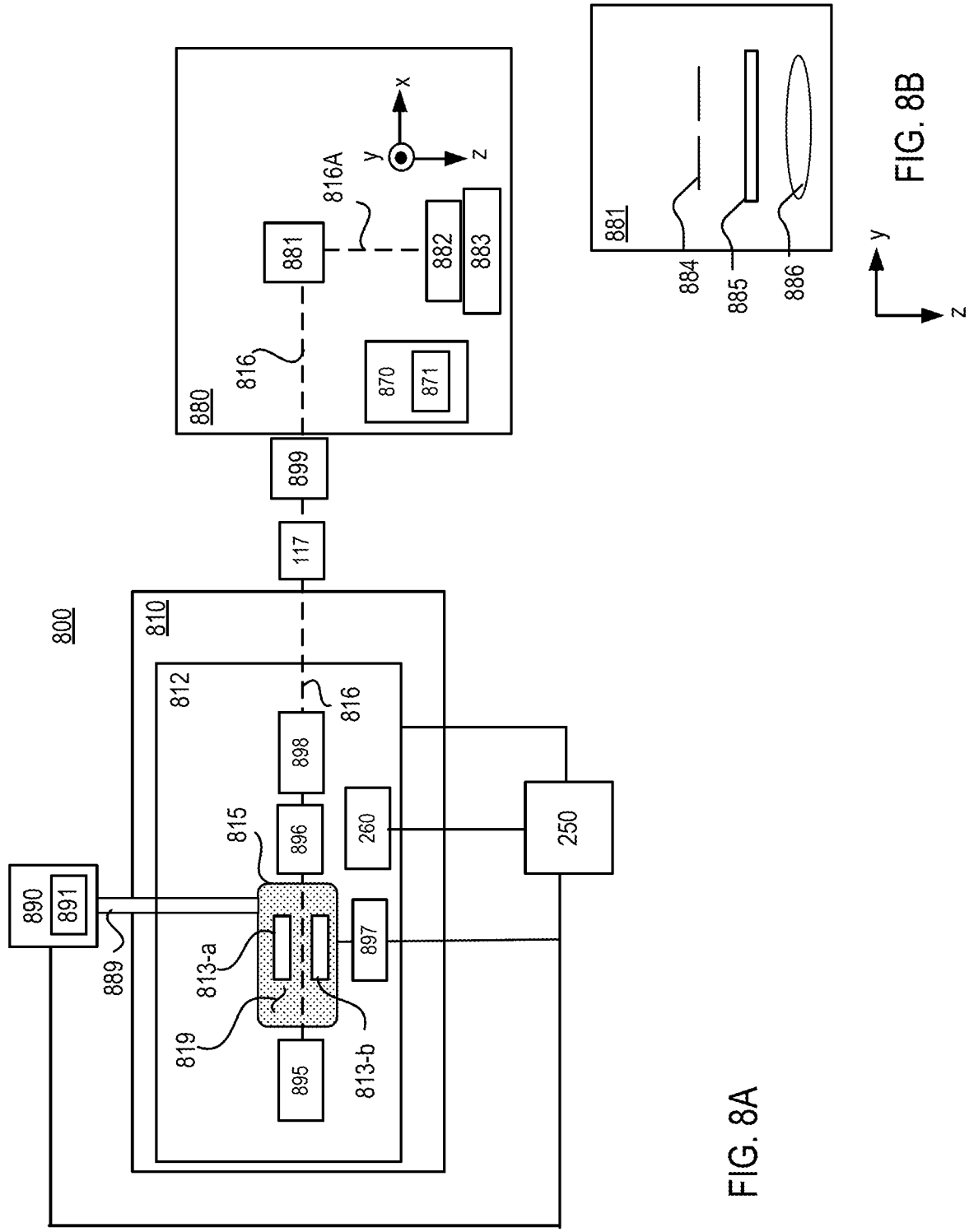

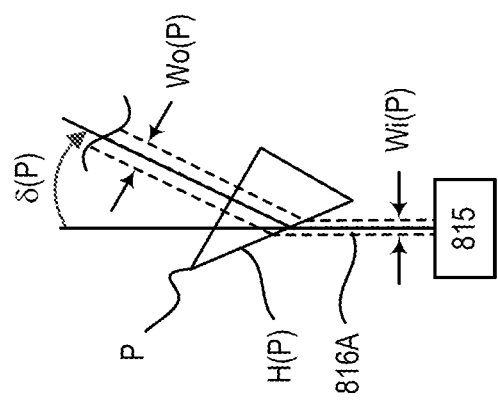

DETERMINATION OF MEASUREMENT ERROR IN AN ETALON

CROSS REFERENCE TO RELATED APPLICATIONS

This application claims priority to U.S. Application No. 63/043,312, filed Jun. 24, 2020 and titled DETERMINATION OF MEASUREMENT ERROR IN AN ETALON, and which is incorporated herein in its entirety by reference.

TECHNICAL FIELD

This disclosure relates to determination of measurement error in an etalon. The etalon may be used in a deep ultraviolet (DUV) optical system.

BACKGROUND

An etalon is an optical cavity made from two partially reflective optical surfaces. The etalon produces an interference pattern and may be used to measure or estimate the wavelength of light that is incident on the etalon.

SUMMARY

In one aspect, a method includes: accessing information relating to an etalon, the etalon associated with a calibration parameter having a pre-set default value, the etalon configured to produce an interference pattern including a plurality of fringes from a received light beam, and the information relating to the etalon including first spatial information related to a first fringe of the plurality of fringes and second spatial information related to a second fringe of the plurality of fringes; determining a first wavelength value of the received light beam based on the spatial information related to the first fringe and an initial value of the calibration parameter; determining a second wavelength value of the received light beam based on the spatial information related to the second fringe and the initial value of the calibration parameter; and comparing the first wavelength value and the second wavelength value to determine a measurement error value.

Implementations may include one or more of the following features.

The method may further include determining whether to adjust the pre-set default value of the calibration parameter based on the measurement error value. The measurement error value may include a difference between the first wavelength value and the second wavelength value, and the pre-set default value may be adjusted to a value that causes a magnitude of the measurement error value to be less than a threshold. The pre-set default value may be adjusted to a value that causes the measurement error value to be zero.

The calibration parameter may include a focal length of a lens at an output of the etalon, and the measurement error may include a difference between the first wavelength value and the second wavelength value.

The first spatial information may include a diameter of the first fringe, and the second spatial information may include a diameter of the second fringe.

The method may further include directing a light beam toward the etalon. The first fringe may be produced by a first portion of the light beam, and the second fringe may be produced by a second portion of the light beam. The light beam may include a plurality of pulses, the first portion of the light beam may include a first one of the plurality of pulses, and the second portion of the light beam may include a second one of the plurality of pulses. The light beam may include a continuous-wave light beam, the first portion of the light beam may include a first sample of the light beam, and the second portion of the light beam may include a second sample of the light beam. The method may further include: changing the initial value of the calibration parameter to an updated value of the calibration parameter; actuating an optical element to thereby change the wavelength of the received light beam; determining a first wavelength value of the received light beam based on the spatial information related to the first fringe and the updated value of the calibration parameter; determining a second wavelength value of the received light beam based on the spatial information related to the second fringe and the updated value of the calibration parameter; and comparing the first wavelength value and the second wavelength value to determine a measurement error value based on the updated value of the calibration parameter. The optical element may be actuated to increase the wavelength or to decrease the wavelength prior to determining the second wavelength value. The first wavelength value and the second wavelength value may be determined more than once each time the optical element is actuated. The method may further include determining whether to adjust the pre-set default value of the calibration parameter by comparing the error measurement value determined based on the initial value of the calibration parameter and the error measurement value determined based on the updated value of the calibration parameter.

The initial value of the calibration parameter may be the pre-set default value.

The first fringe and the second fringe may be in the interference pattern at the same time.

In another aspect, a method for calibrating an etalon includes: accessing information relating to the etalon, the etalon associated with a calibration parameter having a pre-set default value, the etalon configured to produce an interference pattern including a plurality of fringes from a received light beam, and the information relating to the etalon including first spatial information related to a first fringe of the plurality of fringes and second spatial information related to a second fringe of the plurality of fringes; determining a measurement error value of the etalon based on the first spatial information, the second spatial information, and an initial value of the calibration parameter; and analyzing the measurement error value to determine whether to adjust the pre-set default value.

Implementations may include one or more of the following features.

The calibration parameter may include a focal length of a lens at an output of the etalon. The method may further include: determining a first wavelength value based on the first spatial information; and determining a second wavelength value based on the second spatial information. The measurement error may include a difference between the first wavelength value and the second wavelength value.

The calibration parameter may include a plurality of initial values. Determining a measurement error value may include simulating a plurality of measurement error values for each of the plurality of initial values. Each measurement error value may be based on the first spatial information, the second spatial information, and one of the plurality of initial values of the calibration parameter. Analyzing the measurement error values may include analyzing the simulated measurement error values.

In another aspect, an optical measurement apparatus for a light source includes: an etalon including a focusing lens configured to focus light at an image plane; an optical detector configured to detect an interference pattern produced by the etalon and to produce information related to the etalon; and a control system coupled to the optical detector. The etalon is associated with a calibration parameter related to the focusing lens, and the calibration parameter has a pre-set default value. The information includes first spatial information for a first fringe and second spatial information for a second fringe. The control system is configured to: determine a measurement error value of the etalon based on first spatial information from the detector, the second spatial information, and an initial value of the calibration parameter; and analyze the measurement error value to determine whether to adjust the pre-set default value.

Implementations may include one or more of the following features.

The light source may include a deep ultraviolet (DUV) light source.

In another aspect, a light source includes: a light-generation apparatus; and an optical measurement apparatus. The optical measurement apparatus includes: an etalon including a focusing lens configured to focus light at an image plane; an optical detector configured to detect an interference pattern produced by the etalon and to produce information related to the etalon; and a control system coupled to the optical detector. The etalon is associated with a calibration parameter related to the focusing lens, the calibration parameter having a pre-set default value. The information includes first spatial information for a first fringe and second spatial information for a second fringe. The control system is configured to: determine a measurement error value of the etalon based on first spatial information from the detector, the second spatial information, and an initial value of the calibration parameter; and analyze the measurement error value to determine whether to adjust the pre-set default value.

Implementations may include one or more of the following features.

The light-generation apparatus may include a deep ultraviolet (DUV) light source. The light-generation apparatus may include a master oscillator. The light generation apparatus may further include a power amplifier. The light-generation apparatus may include a plurality of master-oscillators.

The light source may further include an optical element configured to receive light from the light-generation apparatus and to direct light to the etalon. The optical element may be a dispersive optical element.

Implementations of any of the techniques described above may include a system, a method, a process, a device, or an apparatus. The details of one or more implementations are set forth in the accompanying drawings and the description below. Other features will be apparent from the description and drawings, and from the claims.

DRAWING DESCRIPTION

Figure 1B:
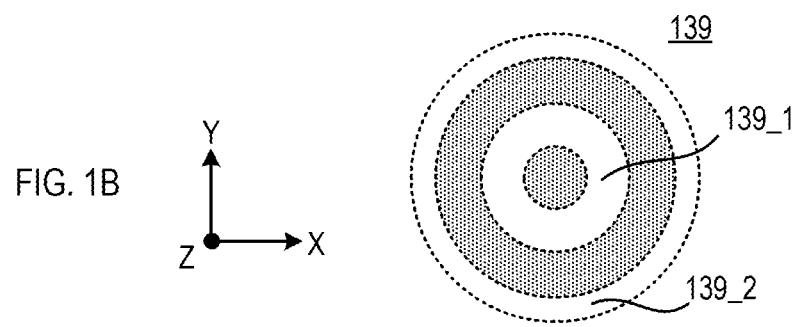
Figure 1C:
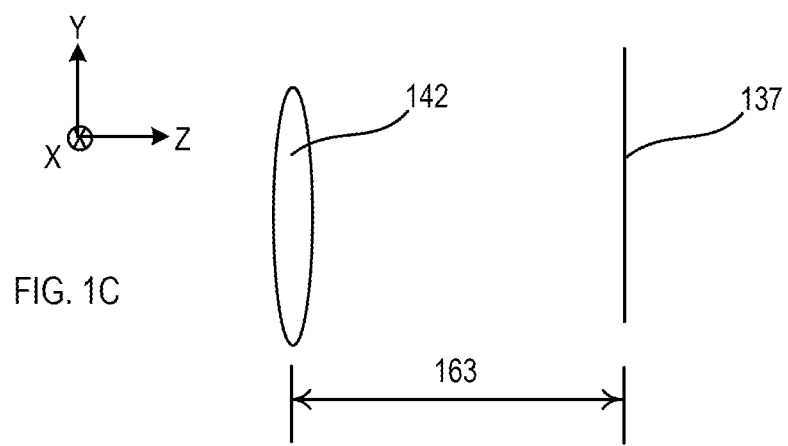
Figure 2C:
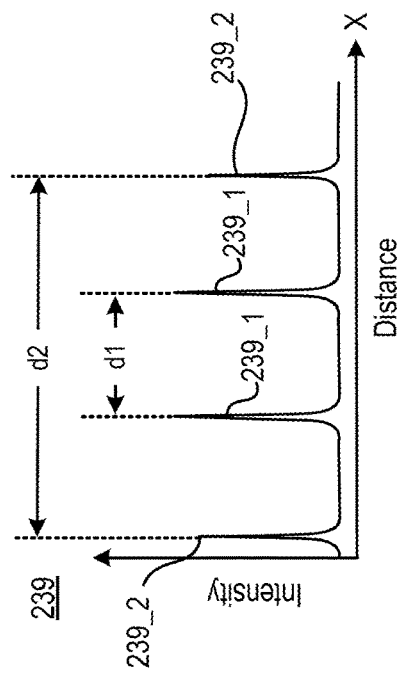
Figure 2B:
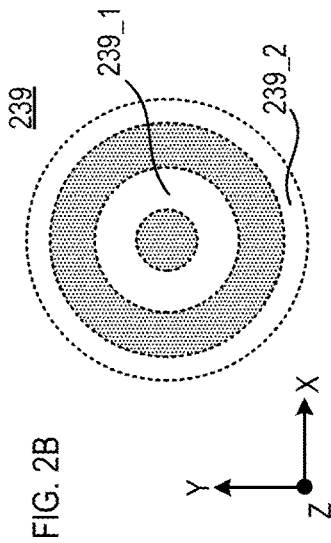
Figure 2A:
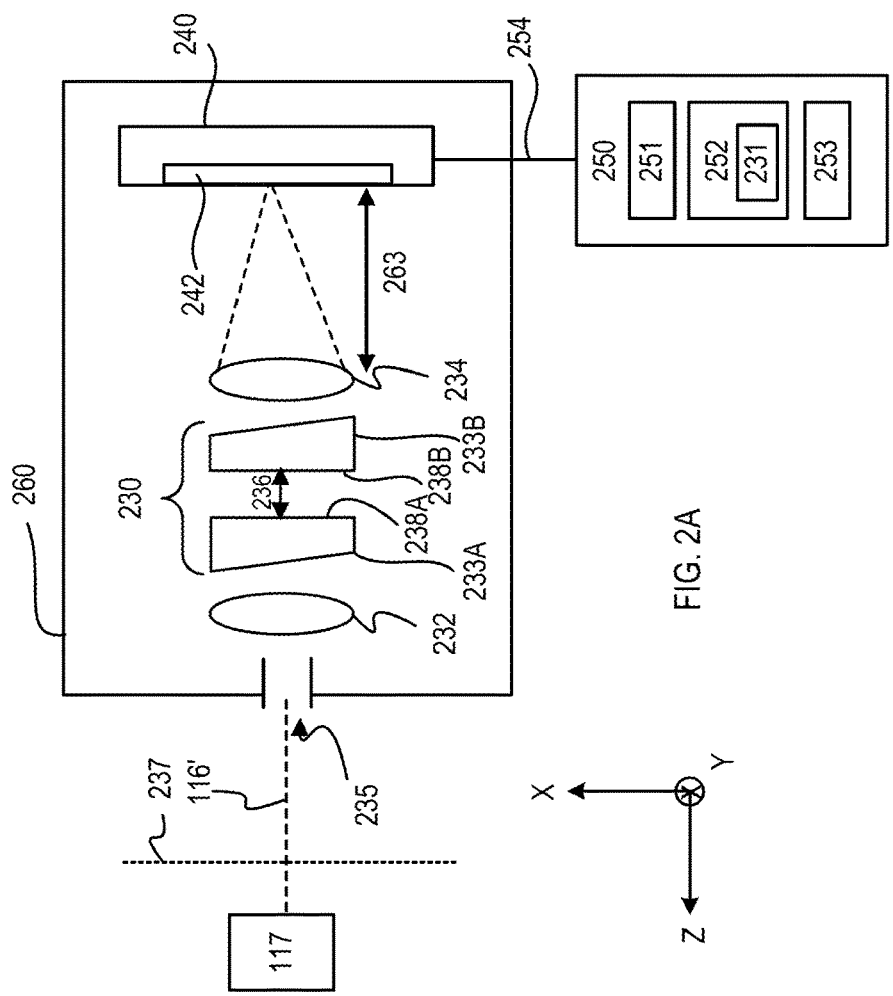
Figure 3:
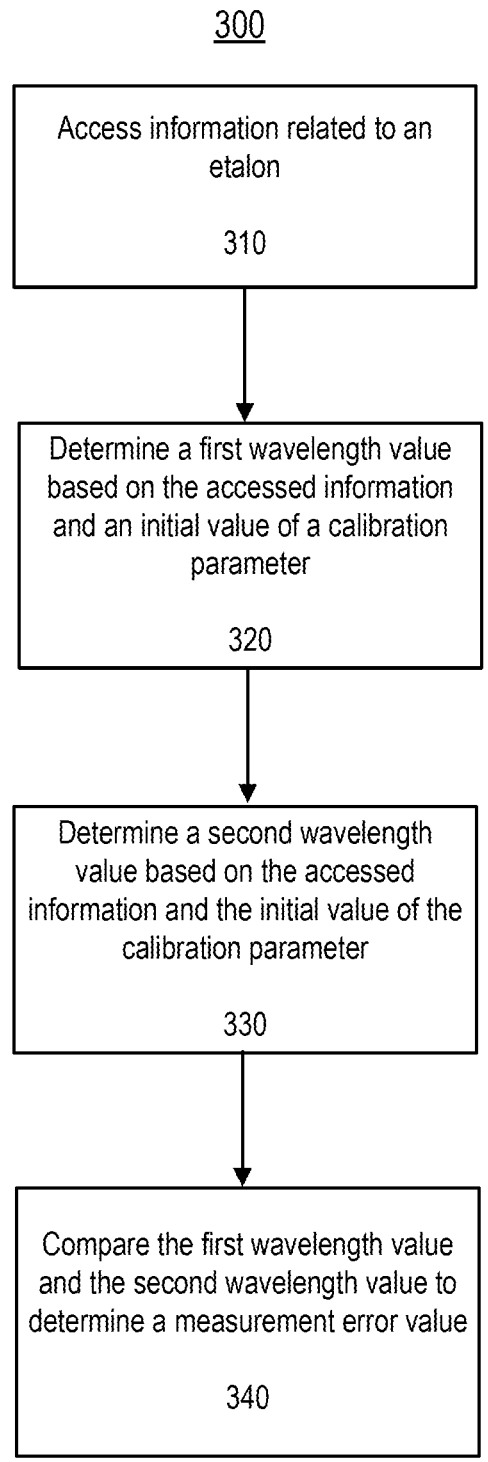
Figure 4:
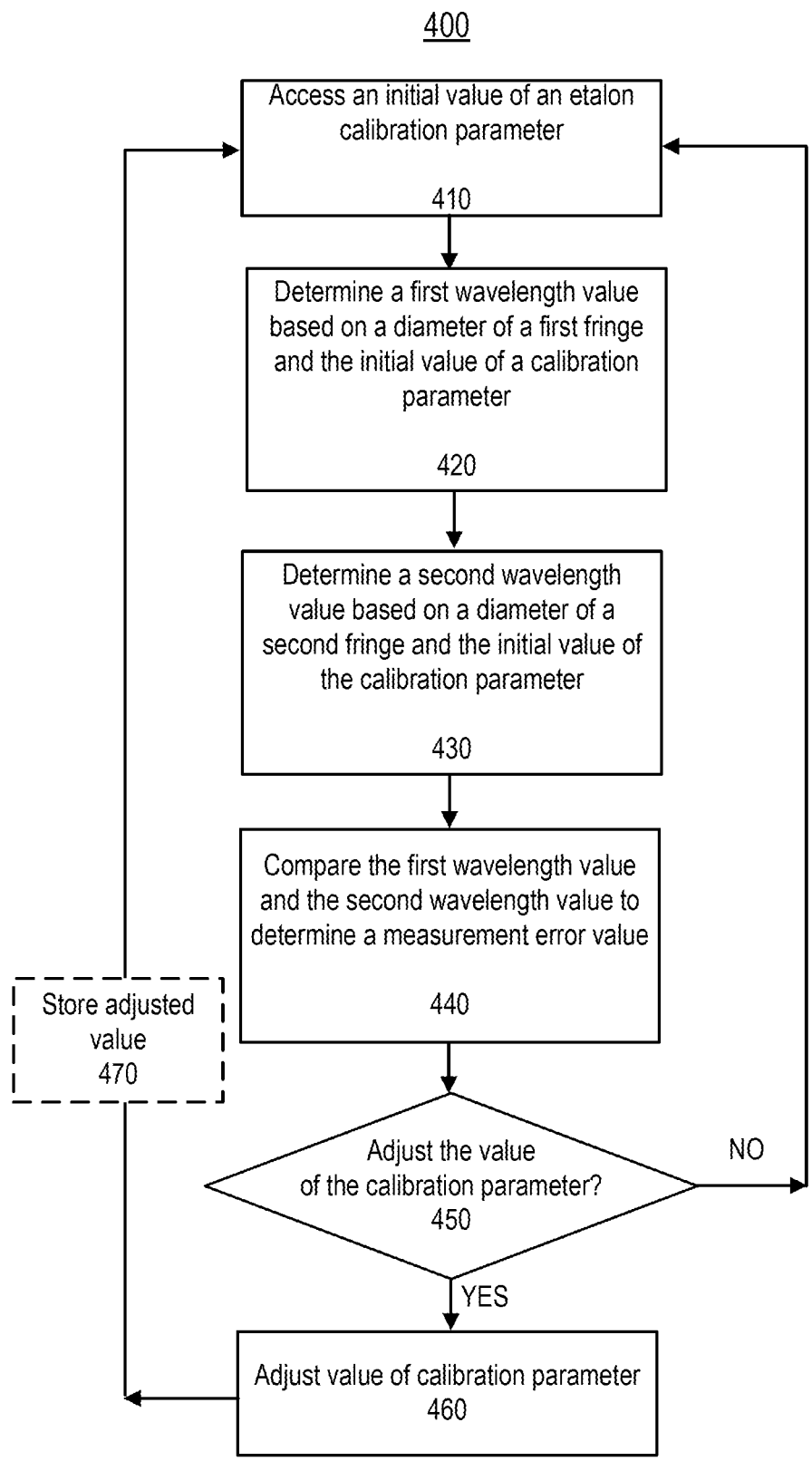

FIG. 1A is a block diagram of an example of a system.
FIG. 1B shows an example of an interference pattern.
FIG. 1C is a block diagram of an aspect of the system of FIG. 1A.
FIG. 2A is a block diagram of an example of an optical measurement apparatus.
FIGS. 2B and 2C relate to another example of an interference pattern.
FIGS. 3 and 4 are flow charts of examples of processes for determining measurement error of an etalon.

Figure 5:
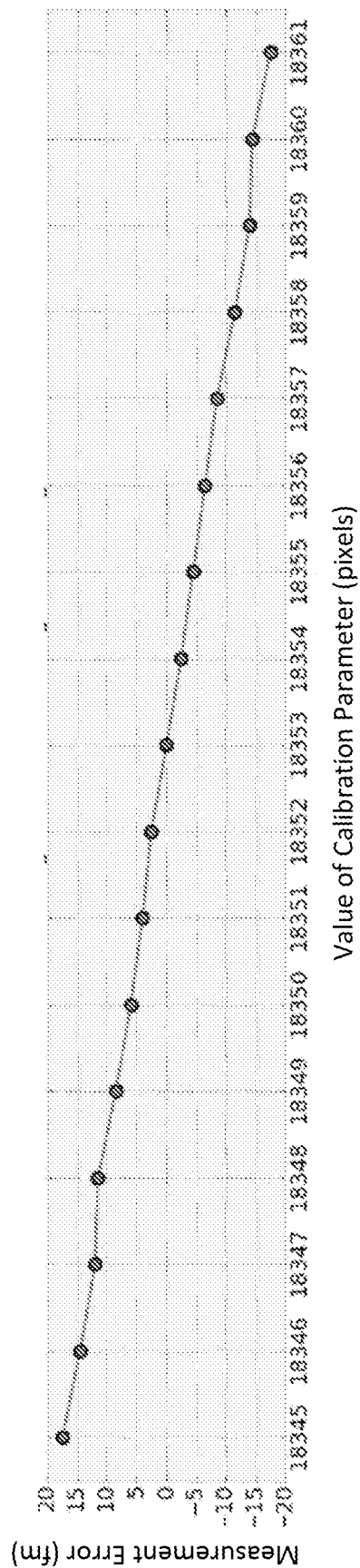
Figure 6:
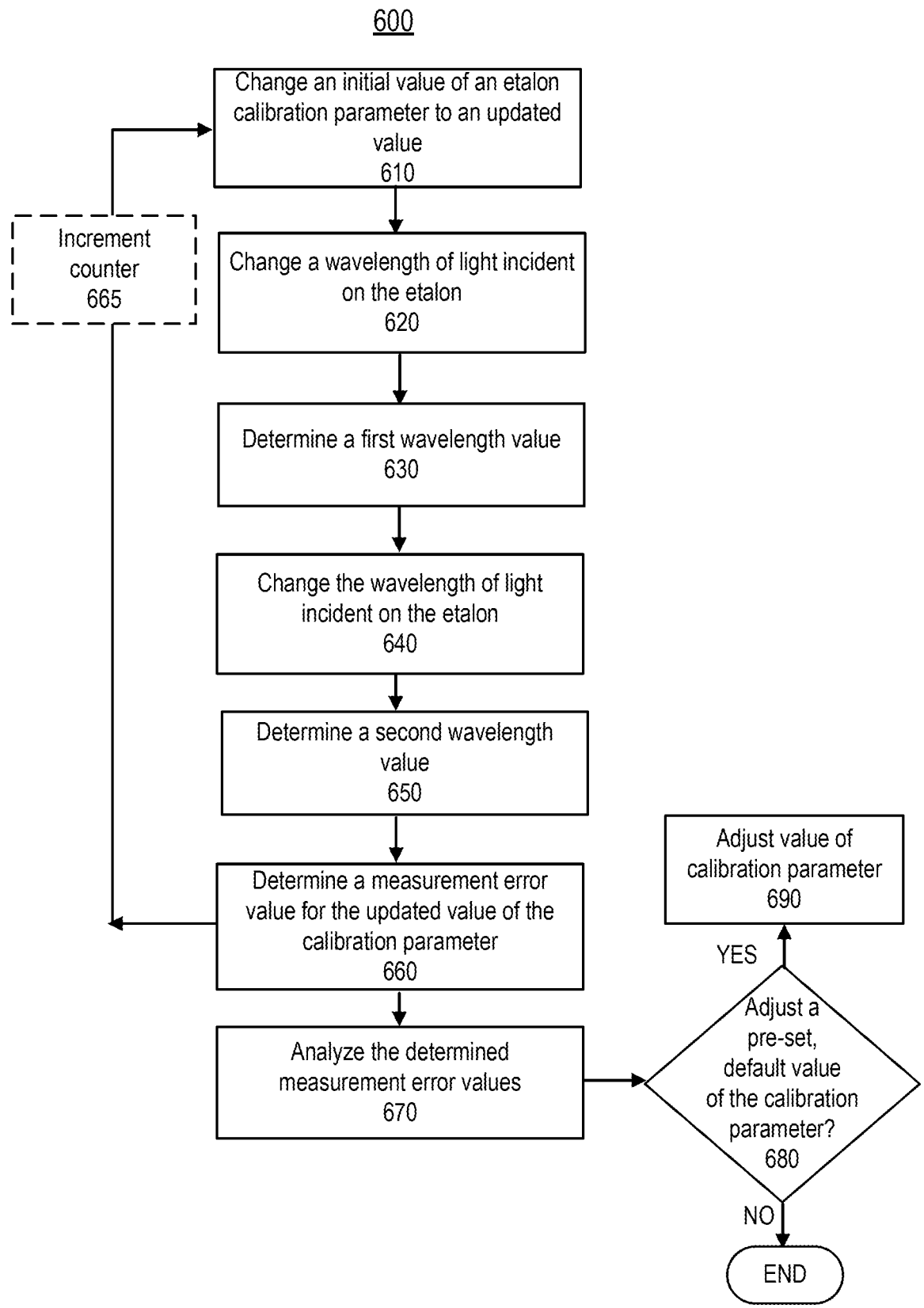
Figure 7:
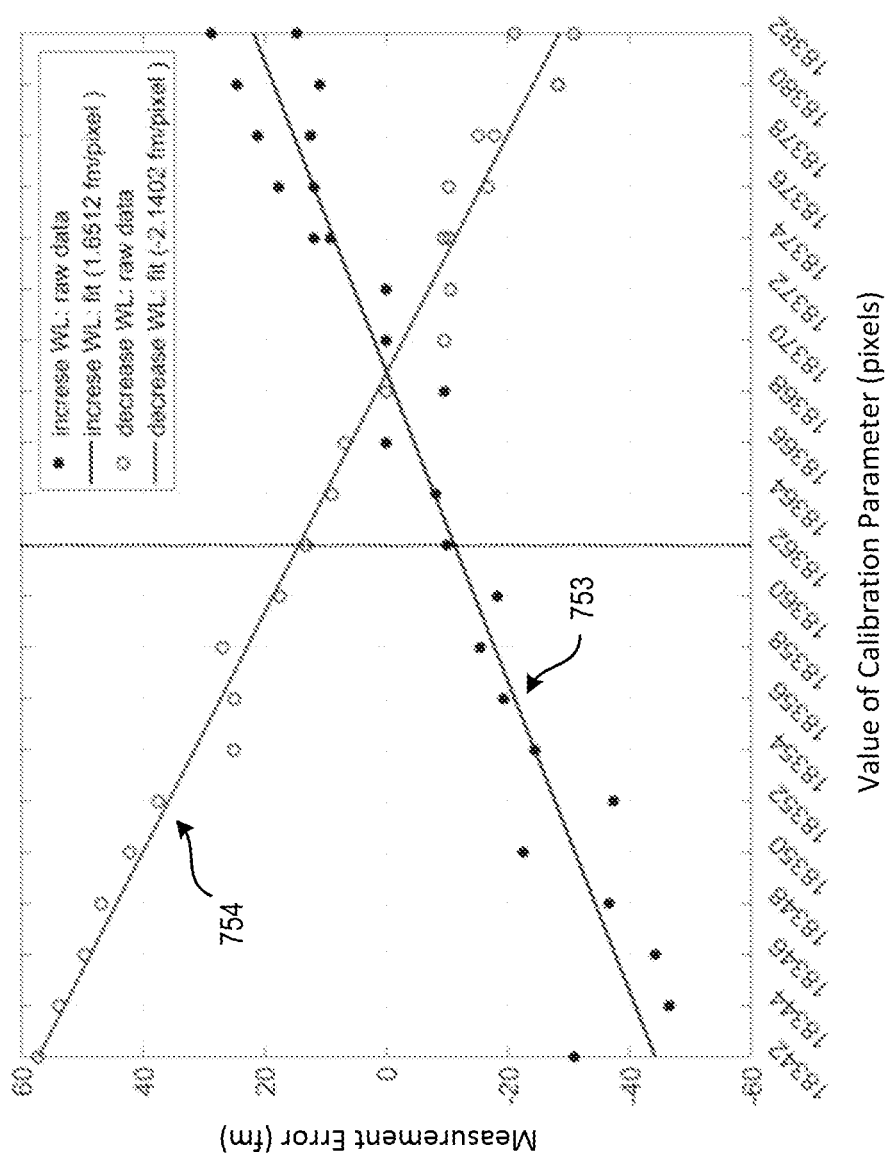
Figure 9A:
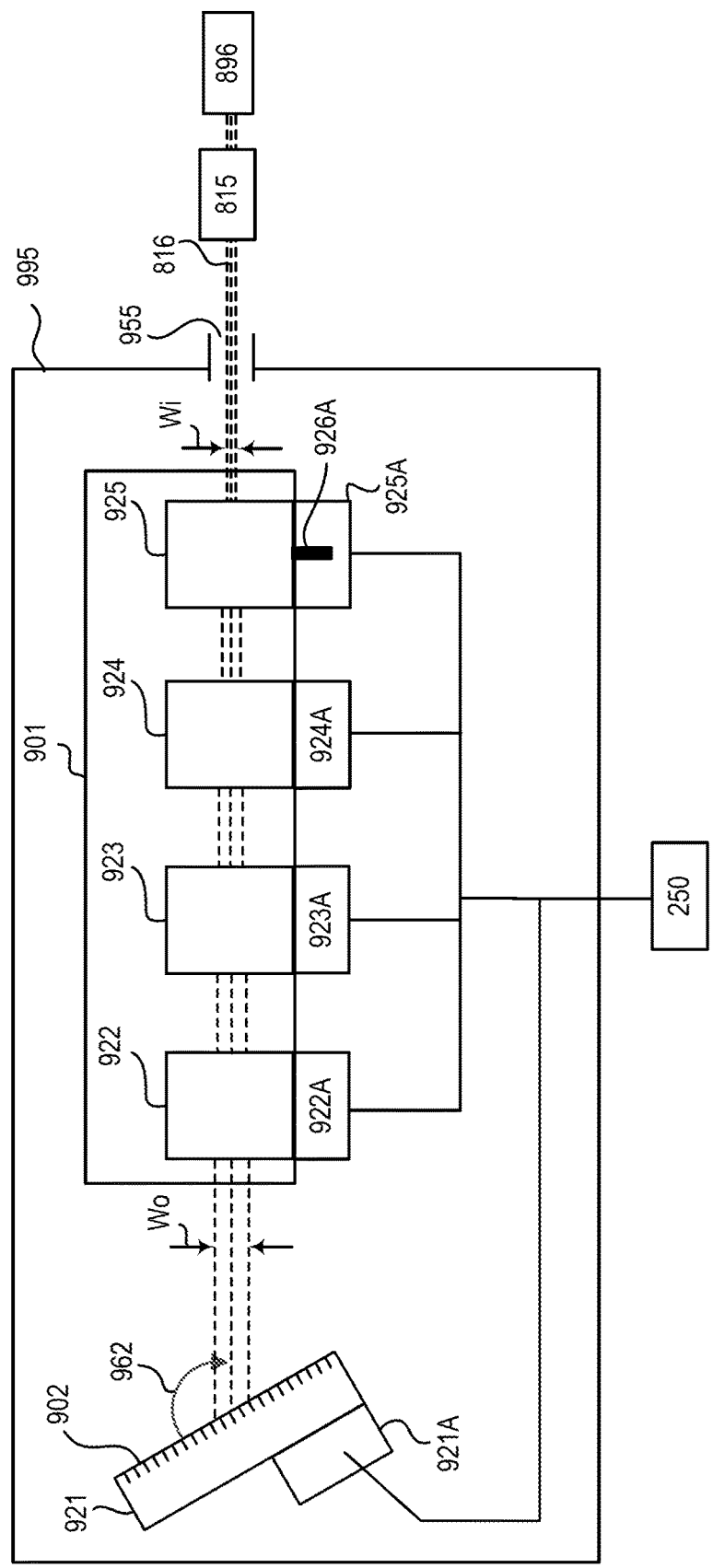
Figure 10:
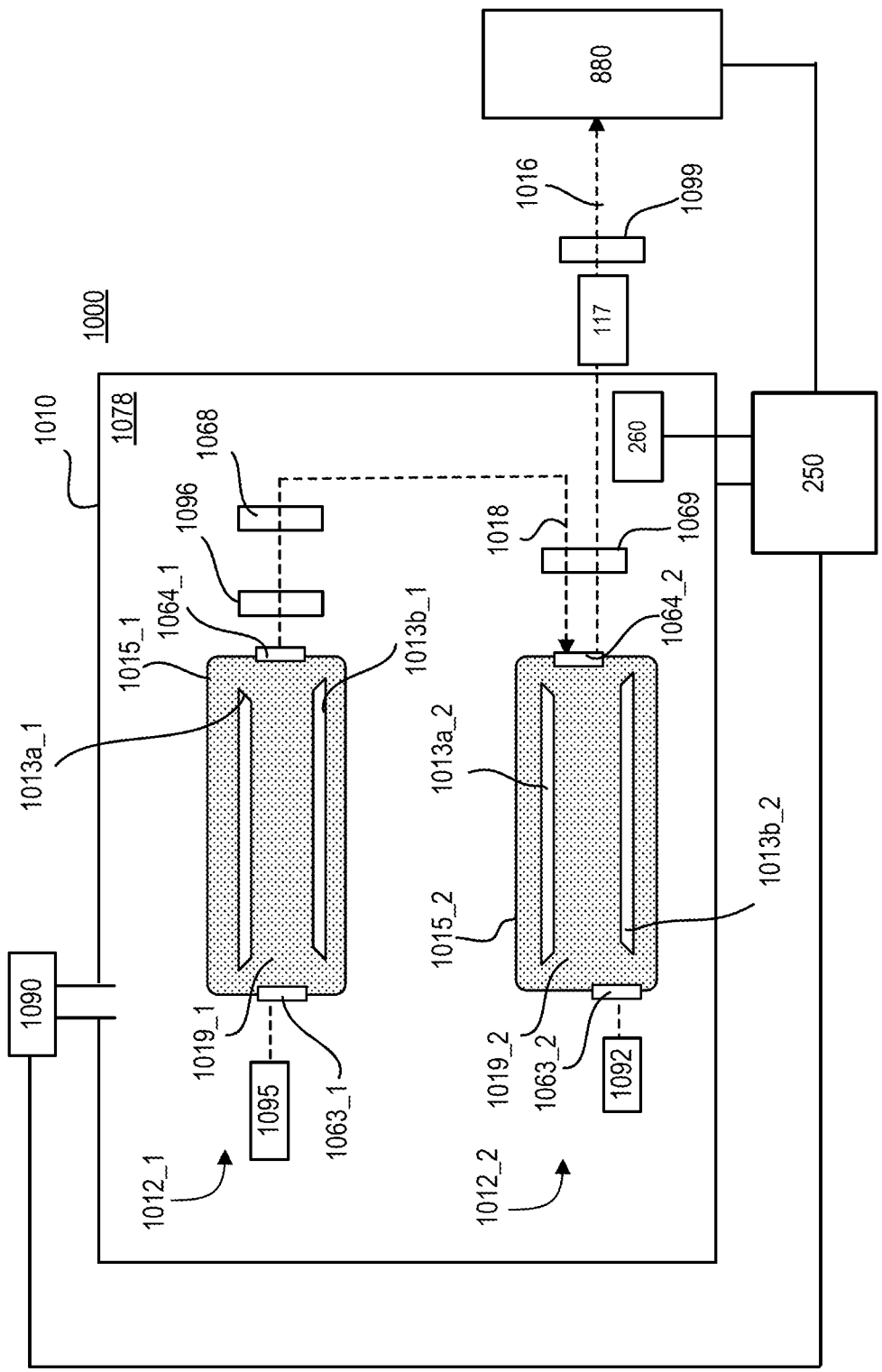

FIG. 5 shows an example plot of measurement error of an etalon.
FIG. 6 is a flow chart of an example of a process for determining measurement error of an etalon.
FIG. 7 shows an example plot of measurement error of an etalon.
FIG. 8A shows an example of a deep ultraviolet (DUV) optical system with which an optical measurement apparatus may be used.
FIG. 8B is an example of a projection optical system.
FIG. 9A is a block diagram of an example of a spectral adjustment apparatus.
FIG. 9B shows an example of a prism.
FIG. 10 shows an example of a deep ultraviolet (DUV) optical system with which an optical measurement apparatus may be used.

DETAILED DESCRIPTION

FIG. 1A is a block diagram of a system 100. In FIG. 1A, a dashed line between elements represents an optical path along which light travels and a solid line between elements represents a signal path along which information and/or data travels. The system 100 includes a light-generation module 110 that produces a light beam 116. The light beam 116 propagates on a path 114 to a device 180. The device 180 is any device that uses the light beam 116. The device 180 may be an optical lithography apparatus (such as the scanner apparatus 880 of FIGS. 8A and 10) or a power amplifier such as (the power amplifier 1012_2 of FIG. 10).

The system 100 also includes a beam separator 117 that directs a portion 116' of the light beam 116 to an optical measurement apparatus 160. The beam separator 117 may be, for example, a beam splitter that directs the portion 116' to the optical measurement apparatus 160 while allowing the remaining light in the light beam 116 to continue propagating to the device 180. The optical measurement apparatus 160 is used to measure the wavelength of the light beam 116. The optical measurement apparatus 160 includes an etalon 130, a detector 140, and a control system 150. The etalon 130 includes two parallel optical elements 133A, 133B, which are separated by a distance 136, and an output lens 134. With additional reference to FIG. 1C, the output lens 134 has a focal length 163, and the output lens 134 focuses incident light at an image plane 137. The image plane 137 coincides with an active region 142 of the detector 140. FIG. 1C is a block diagram of the active region 142 and the image plane 137.

Referring also to FIG. 1B, the output of the etalon 130 is an interference pattern 139 that is focused at the image plane 137. FIG. 1B shows the interference pattern 139 in the image plane 137. In the example of FIG. 1B, the interference pattern 139 is a plurality of concentric rings that are formed at the image plane 137. Two fringes 139_1 and 139_2 are shown in FIG. 1B. The fringe 139_1 is a first order fringe, and the fringe 139_2 is a second order fringe. The first and second order fringes 139_1, 139_2 are two consecutive fringes. The wavelength of the light in the portion 116' is related to the diameter of the fringes in the interference pattern 139 according to Equation 1:

$$\lambda = \frac{2ND}{m}\cos\left(\frac{d}{FD}\right), \qquad \text{Equation (1)}$$

where λ is the wavelength of the light incident on the etalon 130 (the portion 116' in this example), ND is the optical path length between the optical elements 133A, 133B (the distance 136 in this example), m is the order of a particular one of the fringes, d is the diameter of the particular one of the fringes, and FD is the focal length of the output lens 134. The order m of the fringe is an integer number and may be, for example, a relatively large number such as an integer that is equal to or greater than 10,000.

The etalon 130 is used to measure the wavelength of the light in the portion 116'. The etalon 130 is associated with a measurement error that may be absolute at a specific wavelength or variable as a function of wavelength. One source of measurement error that depends on wavelength may occur when a fixed detector in the image plane 137 (such as the detector 140) determines a value for the wavelength using a different order fringe as compared to the prior wavelength determination. In other words, when the wavelength of the same light is measured by different order fringes in the same interference pattern, the measured value of the wavelength based on the first order fringe 139_1 and/or the second order fringe 139_2 may be inaccurate. Specifically, such a measurement error results in the determined value of the wavelength changing artificially between two different measurements even though the true wavelength of the incident light has not changed.

The etalon 130 is associated with at least one calibration parameter 131. The value of FD is a calibration parameter 131. The value of FD is determined when the etalon 130 is manufactured. However, the value of FD may drift or change over the lifetime of the etalon 130. The value of FD may change, for example, because of alignment shifts caused by thermal cycling (heating and/r cooling) that may occur during use of the etalon 130. The alignment shifts may appear as changes in the value of FD. Techniques for determining the value of FD during use and/or during the lifetime of the etalon 130 are discussed below. Details of an example implementation of the optical measurement apparatus 160 are discussed before discussing the techniques related to determining the value of the calibration parameter 131.

FIG. 2A is a block diagram of an optical measurement apparatus 260. The optical measurement apparatus 260 is an example of an implementation of the optical measurement apparatus 160 (FIG. 1A). The optical measurement apparatus 260 includes an input lens 232, an etalon 230, an output lens 234 (or focusing lens 234), and a detector 240. The portion 116' is diffused and passes through an aperture 235 of the optical measurement apparatus 260. The portion 116' may be intentionally diffused by an optical diffuser (not shown) placed at a plane 237, which is between the beam separator 117 and the aperture 235. The aperture 235 is at a focal plane of the input lens 232. The input lens 232 collimates the portion 116' before it enters the etalon 230. The output lens 234 has a focal length 263 and focuses light to an image plane. The detector 240 is positioned such that an active region 242 of the detector 240 coincides with the image plane.

In the example shown in FIG. 2A, the etalon 230 includes a pair of partially reflective optical elements 233A and 233B. The optical elements 233A and 233B are between the input lens 232 and the output lens 234. The optical elements 233A and 233B have respective reflective surfaces 238A and 238B that are spaced a distance 236 apart. The distance 236 may be a relatively short distance (for example, millimeters to centimeters) apart. The optical elements 233A and 233B are wedged shape to prevent the rear surfaces (the surfaces opposite the surfaces 238A and 238B) from producing interference fringes. The rear surfaces may have an anti-reflective coating. Other implementations of the etalon 230 are possible. For example, in other implementations, the optical elements 233A and 233B are parallel plates and are not wedge-shaped. In yet another example, the etalon 230 may include only a single plate that has two parallel partially reflecting surfaces.

Referring also to FIG. 2B, the etalon 230 interacts with the portion 116' and outputs an interference pattern 239. FIG. 2B shows the interference pattern 239 in the image plane of the lens 234 at an instance in time. The interference pattern 239 includes a plurality of fringes. Two of the plurality of fringes (239_1 and 239_2) are shown in FIG. 2B. The interference pattern 239 includes regions without light created by destructive interference of the portion 116' and regions with light created by constructive interference of the portion 116'. The regions of constructive interference are the fringes 239_1 and 239_2. The regions without light are shown with grey shading and are between the regions of light. The fringes 239_1 and 239_2 are concentric rings of light in the image plane of the output lens 234. Each ring in the set of fringes is an order (m) of the interference pattern, where m is an integer number equal to or greater than one. The fringe 239_1 is the first order fringe, and the fringe 239_2 is the second order fringe.

The interference pattern 239 is sensed at the active region 242 of the detector 240. The detector 240 is any type of detector capable of sensing the light in the interference pattern 239. For example, the active region 242 may be a linear photodiode array that includes multiple elements of the same size arranged along a single dimension at an equal spacing in one package. Each element in the photodiode array is sensitive to the wavelength of the portion 116'. As another example, the detector 240 may be a two dimensional sensor such as a two-dimensional charged coupled device (CCD) or a two-dimensional complementary metal oxide semiconductor (CMOS) sensor.

The detector 240 is connected to a control system 250 via a data connection 254. The control system 250 includes an electronic processing module 251, an electronic storage 252, and an I/O interface 253. The electronic processing module 251 includes one or more processors suitable for the execution of a computer program such as a general or special purpose microprocessor, and any one or more processors of any kind of digital computer. Generally, an electronic processor receives instructions and data from a read-only memory, a random access memory (RAM), or both. The electronic processing module 251 may include any type of electronic processor. The electronic processor or processors of the electronic processing module 251 execute instructions and access data stored on the electronic storage 252. The electronic processor or processors are also capable of writing data to the electronic storage 252.

The electronic storage 252 is any type of computer-readable or machine-readable medium. For example, the electronic storage 252 may be volatile memory, such as RAM, or non-volatile memory. In some implementations, the electronic storage 252 includes non-volatile and volatile portions or components. The electronic storage 252 may store data and information that is used in the operation of the control system 250. The electronic storage 252 also may store instructions (for example, in the form of a computer program) that cause the control system 250 to interact with the optical measurement apparatus 260. For example, the instructions may be instructions that cause the electronic processing module 251 to implement the processes discussed with respect to FIGS. 3, 4, and 6. The electronic storage 252 also stores information about the etalon 230, such as an initial value of a pre-defined calibration parameter 231, or a pre-set value of the calibration parameter 231.

The pre-defined or pre-set value may be a value determined during factory calibration or a value determined using a process such as the processes 300, 400, or 600 discussed below. The calibration parameter 231 may be, for example, a focal length of the lens 234. In another example, the electronic storage 252 also may store a specification that indicates a range of values or a value related to an acceptable amount of measurement error for the etalon 230.

The I/O interface 253 is any kind of interface that allows the control system 250 to exchange data and signals with an operator, other devices, and/or an automated process running on another electronic device. For example, in implementations in which data or instructions stored on the electronic storage 252 may be edited, the edits may be made through the I/O interface 253. The I/O interface 253 may include one or more of a visual display, a keyboard, and a communications interface, such as a parallel port, a Universal Serial Bus (USB) connection, and/or any type of network interface, such as, for example, Ethernet. The I/O interface 253 also may allow communication without physical contact through, for example, an IEEE 802.11, Bluetooth, or a near-field communication (NFC) connection.

The control system 250 is coupled to various components of the apparatus 260 through a data connection 254. The data connection 254 is any type of connection that allows transmission of data, signals, and/or information. For example, the data connection 254 may be a physical cable or other physical data conduit (such as a cable that supports transmission of data based IEEE 802.3), a wireless data connection (such as a data connection that provides data via IEEE 802.11 or Bluetooth), or a combination of wired and wireless data connections.

FIG. 3 is a flow chart of a process 300. The process 300 is used to determine a measurement error value. The process 300 may be performed by the control system 250 (FIG. 2A). For example, the process 300 may be performed by one or more electronic processors in the processing module 251. The process 300 is discussed with respect to the measurement apparatus 260 (FIG. 2A).

Information related to the etalon 230 is accessed (310). The information may be accessed from the electronic storage 252 or through the I/O interface 253. The information related to the etalon 230 includes first spatial information related to a first fringe and second spatial information related to a second fringe. The first fringe and the second fringes may be two different fringes formed at the same time. For example, the first fringe may be the fringe 239_1 and the second fringe may be the fringe 239_2. As discussed above, the fringe 239_1 and the fringe 239_2 are two different fringes formed by a single pulse of light or by the same sample of a continuous wave light beam. The process 400 discussed with respect to FIG. 4 is an example of such an approach. In other implementations, the first fringe is a fringe in an interference pattern formed at a first instance in time, and the second fringe is a fringe in an interference pattern formed at a second instance in time. For example, in these implementations, the first fringe may be a fringe formed by a first pulse of light that is incident on the etalon 230, and the second fringe may be a fringe formed by a second pulse of light that is incident on the etalon 230 after the first pulse of light. The process 600 discussed with respect to FIG. 6 is an example of such an approach. The first spatial information may be a diameter of the first fringe. The second spatial information may be a diameter of the second fringe.

The information associated with the etalon 230 also includes an initial value of the calibration parameter 231. The initial value of the calibration parameter 231 may be a factory calibration value that was determined when the etalon 230 was assembled. In some implementations, the initial value of the calibration parameter 231 is a value determined in a previous execution of the process 300. The pre-set default value of the calibration parameter 231 may be stored on and accessed from the electronic storage 252.

A first wavelength value is determined based on the spatial information related to the first fringe and the initial value of the calibration parameter 231 (320). A second wavelength value is determined based on the spatial information related to the second fringe and the initial value of the calibration parameter 231 (330).

The first wavelength value and the second wavelength value are compared to determine a measurement error value (340). The measurement error value is a value that represents the difference between the first wavelength value and the second wavelength value. The measurement error value may be determined, for example, by subtracting the first wavelength value from the second wavelength value, or vice versa. Other implementations are possible. For example, the measurement error value may be a ratio of the first wavelength value to the second wavelength value.

FIG. 4 is a flow chart of a process 400. The process 400 is another example of a process for determining a measurement error value and a value of the calibration parameter 231. The process 400 is discussed with respect to the interference pattern 239 (FIGS. 2B and 2C), which is the output of the etalon 230 at an instance in time. The process 400 may be performed by the control system 250.

An initial value of the calibration parameter 231 is accessed (410). The value of the calibration parameter 231 may be accessed from the electronic storage 252 or provided to the control system 250 via the I/O interface 253. The calibration parameter 231 is FD in this example. The initial value of the calibration parameter 231 may be a predetermined and default value that was determined when the etalon 230 was manufactured. The initial value of the calibration parameter 231 may be a value of the calibration parameter that was determined in a prior iteration of the process 400.

The diameter of the first fringe 239_1 (fringe diameter d1) is determined. For example, and referring to FIGS. 2B and 2C, the fringe diameter d1 may be determined based on data produced by the detector 240. In this example, the fringe diameter d1 may be a count of pixels between two points on opposite sides of the first fringe 239_1 as determined from image data produced by the detector 240. Other implementations are possible, and the fringe diameters d1 and d2 may be determined in any manner.

A first wavelength value (ii) is determined based on the determined fringe diameter d1 and the initial value of the calibration value (420). For example, the first wavelength (ii) may be determined using the initial value of the parameter 231, the order number (m) of the first fringe 239_1, the known value of ND, and the fringe diameter d1 in Equation 1. Similarly, the diameter of the second fringe 239_2 (fringe diameter d2) is determined. A second wavelength value ($\lambda 2$) is determined based on the determined fringe diameter d2 and the initial value of the calibration value (430). The second wavelength value ($\lambda 2$) may be determined using the initial value of the parameter 231, the order number (m) of the second fringe 239_2, the known value of ND, and the fringe diameter d2 in Equation 1. The first fringe 239_1 and the second fringe 239_2 have consecutive orders. For example, if the order (m) of the first fringe 239_1 is 10,001, the order (m) of the second fringe 239_2 is 10,002.

The first wavelength value ($\lambda 1$) and the second wavelength value ($\lambda 2$) are compared to determine a measurement error (440). The measurement error may be determined by finding the difference between the first wavelength value ($\lambda 1$) and the second wavelength value ($\lambda 2$). In the absence of measurement error, the first wavelength value and the second wavelength value are the same because the light that was used to create the first fringe 239_1 and the second fringe 239_2 is the same. Thus, the difference between the first wavelength value ($\lambda 1$) and the second wavelength value ($\lambda 2$) is a characterization of the measurement error. The difference may be determined by subtracting the first wavelength value ($\lambda 1$) from the second wavelength value ($\lambda 2$), or vice versa. Moreover, the measurement error may be an absolute value of the difference. Thus, the measurement error may be a positive number, a negative number, or zero (in the case of no measurement error).

The measurement error is compared to a specification to determine whether the calibration parameter 231 (FD in this example), should be adjusted. The specification may be a range of values that includes positive and negative values or a single threshold value that is positive. The measurement error is compared to the specification to determine whether to adjust the value of the calibration parameter 231 (450). If the value of the calibration parameter 231 is within the specification or less than the threshold value, then the value of the calibration parameter 231 is accurate and the process 400 returns to (410) to continue monitoring for measurement error. If the value of the calibration parameter 231 is outside of the specification, the value of the calibration parameter 231 is adjusted (460). The value of the calibration parameter 231 is adjusted until the first wavelength value ($\lambda 1$) and the second wavelength value ($\lambda 2$) are within the specification. For example, if the specification is zero, the value of the calibration parameter 231 is adjusted until Equation 1 yields the same wavelength value for the first fringe 239_1 and the second fringe 239_2.

After the value of the calibration parameter 231 has been adjusted, the process 400 returns to (410) to continue monitoring the measurement error of the etalon, or the process 400 may end. The adjusted value of the calibration parameter 231 may be stored on the electronic storage 252 (470). In implementations in which the adjusted value of the calibration parameter 231 is stored, the adjusted value of the calibration parameter 231 may be used as the initial value of the calibration parameter 231 in a subsequent performance of the process 400. In some implementations, the adjusted calibration parameter 231 is not stored and/or is not used in a subsequent performance of the process 400. In these implementations, the factory determined value of the calibration parameter 231 is always used as the initial value of the calibration parameter 231.

FIG. 5 is a plot of example data that shows measurement error as a function of the value of the calibration parameter 231 (FD). In the example of FIG. 5, the measurement error is the difference between the first wavelength value ($\lambda 1$) determined in (420) and the second wavelength value ($\lambda 2$) determined in (430). The factory determined value of the calibration parameter 231 was 18352 pixels. However, as shown in FIG. 5, using the factory determined value of the calibration parameter 231 resulted in a measurement error of about 2.5 femtometers (fm). The value of the calibration parameter 231 was varied through the range of values shown in FIG. 5, and the measurement error was determined at the various values of the calibration parameter 231. As shown in FIG. 5, the measurement error was zero when the value of the calibration parameter 231 was 18353 pixels. The value of the calibration parameter 231 is adjusted to be equal to 18353 pixels, and the wavelength of the portion 116' is measured using the interference pattern output by the etalon 130 and Equation 1 (with the updated value of the FD). By adjusting the value of the calibration parameter 231, the measurement error is removed so that the wavelength value determined from the output of the etalon 230 is accurate.

FIG. 6 is a flow chart of a process 600. The process 600 is another example of a process for determining a measurement error of an etalon (such as the etalon 130 or the etalon 230). The process 600 is discussed with respect to the etalon 230 and the control system 250.

An initial value of the calibration parameter 231 is changed to an updated value (610). The initial value of the calibration parameter 231 may be a factory calibrated value, a value determined during prior operational use of the etalon 230, a value generated by an automated process (such as a random process), or a value provided by an operator of the control system 250. The initial value of the calibration parameter 231 may be changed by adding a pre-determined constant amount to the initial value of the calibration parameter 231. In some implementations, the initial value of the calibration parameter 231 is changed by a specific amount indicated by an operator of the control system 250 or by a pre-programmed recipe or formula.

The wavelength of the light in the portion 116' is changed (620). The wavelength of the light in the portion 116' is changed by a known amount. For example, the wavelength of the light in the portion 116' may be changed by actuating an optical element (such as the prism 922, 923, 924, or 925 of FIG. 9A) associated with the light source 110 by a known amount such that the wavelength of light that exits the optical element is changed relative to the light incident on the optical element by a known amount. Next, the process 600 estimates the wavelength value of the light in the portion 116' using one or more instances of the interference pattern 239 output by the etalon 230, where each of the two instances is output at a different time. For example, the light beam 116 (and the portion 116') may be a pulsed light beam that includes pulses of light, each separated from an adjacent pulse by a finite amount of time during which the light-generation module 110 does not emit light. In this example, the first instance of the interference pattern 239 is produced by irradiating the etalon 230 with a first pulse in the portion 116' and the second instance of the interference pattern 239 is produced by irradiating the etalon 230 with a second pulse in the portion 116'.

The first wavelength value ($\lambda 1$) is determined (630) using a fringe from the first instance of the interference pattern 239. The first wavelength value ($\lambda 1$) is determined using Equation 1, with m being the order of the fringe, FD being the updated value of the calibration parameter 231 determined in (610), and d being the diameter of the fringe. The first wavelength value ($\lambda 1$) may be determined from more than one instance of the interference pattern 239. For example, the first wavelength value ($\lambda 1$) may be determined from 50 or more instances of the interference pattern 239. The various values of the first wavelength value ($\lambda 1$) may be averaged together or otherwise filtered to remove or reduce noise, and the averaged or filtered value may be used as the first wavelength value ($\lambda 1$).

The wavelength of the light in the portion 116' is again changed (640). The wavelength of the light in the portion 116' may be changed by the same known amount as in (620). The second wavelength value (λ2) is determined (650) using a fringe from one or more instances of the interference pattern 239. The second wavelength value (λ2) is determined in the same manner as discussed in (630), by using Equation 1, with m being the order of the fringe, FD being the updated value of the calibration parameter 231 determined in (610), and d being the diameter of the fringe. The second wavelength value (λ2) may be determined from more than one instance of the interference pattern 239. For example, the second wavelength value (λ2) may be determined 10, 50, or 100 times and then averaged to mitigate the effects of noise and mechanical vibrations.

A measurement error associated with the updated value of the calibration parameter 231 is determined (660). The measurement error is the difference between the determined first wavelength value (λ1) and the determined second wavelength value (λ2), taking into account the nominal sensitivity (NS) of the system that controls the actual wavelength of the portion 116' (the actuated optical element in this example). The nominal sensitivity is a constant value and may be determined by the manufacturer and stored on the electronic storage 252. The nominal sensitivity is the amount of change in wavelength with respect to a unit change in the optical element that determines the wavelength of light incident on the etalon 230. For example, if the optical element is a prism coupled to a PZT actuator, the nominal sensitivity is the amount of wavelength change for each unit change in the prism position. The measurement error (ME) may be determined from Equation 2:

$$ME=(S-NS)(OA) \quad \text{Equation (2)},$$

where ME is the measurement error, S is the current sensitivity, NS is the nominal sensitivity, and OA is a measure of actuation of the optical element in units of distance. OA may be determined by Equation 3:

$$OA=P2-P1 \quad \text{Equation (3)},$$

where P2 is the position of the optical element when light having a second wavelength is provided by the optical element, and P1 is the position of the optical element when light having a first wavelength is provided by the optical element. The current sensitivity (S) is computed based on measured wavelength and change in position of the optical element, and may be determined from Equation 4:

$$S = \frac{(\lambda 2 - \lambda 1)}{P2 - P1}, \quad \text{Equation (4)}$$

where λ1 is the first wavelength value determined in (630), λ2 is the second wavelength value determined in (650), P2 is the position of the optical actuator when light having the second wavelength value (λ2) is provided to the etalon 230, and P1 is the position of the optical actuator when light having the first wavelength value (λ1) is provided to the etalon 230. Although the above examples related to Equations 2, 3, and 4 discuss the position of the optical element, other distance metrics that are related to the position of the optical element may be used. For example, in implementations in which the relationship between the position of the actuator and the position of the optical element is known, the position of the actuator may be used as the position of the optical element.

The measurement error (ME) is stored on the electronic storage 252 or output via the I/O interface 253.

The process 600 may return to (610) to determine the measurement error (ME) for a different updated value of the calibration parameter 231 using (610)-(660) as discussed above and for another wavelength of the portion 116'. For example, the wavelength may be increased or decreased in (620) as compared to the prior iteration of (610)-(660). In some implementations, a counter is incremented (665) each time the process 600 returns to (610) to track how many times the measurement error has been determined.

After the measurement error has been determined for more than one value of the calibration parameter 231 or for more than a specified number of values of the calibration parameter 231, the determined calibration values are analyzed (670). For example, the absolute value of the measurement errors may be determined, and the minimum error measurement value found from the absolute values. The value of the calibration parameter 231 that is associated with the minimum error measurement is determined.

For example, FIG. 7 shows two sets of determined measurement error values in femtometers (fm) as a function of the updated value of the calibration parameter 231 in pixel values. Each measurement error value in the first set is shown with a solid round symbol. Each measurement error value in the second set is shown with an open round symbol. The first set of measurement error values was determined by performing (610)-(660) for multiple different values of the calibration parameter 231. Each time the value of the calibration parameter 231 was updated at (610) to a different value of the calibration parameter 231, an optical element (such as a prism) was actuated to increase the wavelength of the light in the portion 116', and the measurement error is determined at (660). The second set is shown as the plot 754. The second set of measurement error values was determined by performing (610)-(660) for multiple different values of the calibration parameter 231. Each time the value of the calibration parameter 231 was updated at (610) to a different value of the calibration parameter 231, an optical element (such as a prism) was actuated to decrease the wavelength of the light in the portion 116'.

The first set of measurement values was fit to a linear relationship 753, and the second set of measurement values was fit to a linear relationship 754. The value of FD that corresponds to where the linear relationship 753 and the relationship 754 intersect is the minimum measurement error. As shown in FIG. 7, the slope of the relationship 753 and the relationship 753 are opposite in magnitude, but also may be different in absolute value. The difference in absolute value may arise from hysteresis in the actuator that moves the optical element. In the example of FIG. 7, the actuator was a piezoelectric actuator that was first compressed from its nominal size to actuate the prism to increase the wavelength (to generate the first set of measurement error values) and then expanded back to its nominal size to decrease the wavelength (to generate the second set of measurement error values). The mechanical effects that arise from the compression and expansion resulted in slightly different absolute value f of the slope of the relationship 753 as compared to the absolute value of the slope of the relationship 754.

In the example shown in FIG. 7, the value of the calibration parameter 231 that corresponds to the minimum measurement error was about 18369. In contrast, the pre-set, default value of the calibration parameter 231 was about 18362, and is associated with higher measurement errors.

The pre-set, default value of the calibration parameter 231 is adjusted if using the default value results in a measurement error that is greater than a specification (680). In the example of FIG. 7, the pre-set default value of the calibration parameter 231 results in a measurement error value that exceeds the specification, and the value of the calibration parameter 231 is adjusted to be the value of the calibration parameter 231 that corresponds to the minimum value of the measurement error (690). The process 600 then ends.

FIGS. 8A and 10 show examples of deep ultraviolet (DUV) optical systems with which the optical measurement apparatus 160 or 260 may be used. In the examples below, the optical measurement apparatus 260 is shown as used with a DUV optical system.

Referring to FIGS. 8A and 8B, a system 800 includes a light-generation module 810 that provides an exposure beam (or output light beam) 816 to a scanner apparatus 880. The light-generation module 810 and the scanner apparatus 880 are implementations of the light-generation module 110 and the device 180, respectively (FIG. 1A).

The system 800 also includes the beam separator 117, the optical measurement apparatus 260, and the control system 250. The beam separator 117 directs a portion of the exposure beam 816 to the optical measurement apparatus 260 that is used to measure the wavelength of the exposure beam 816. The control system 250 is coupled to the optical measurement apparatus 260. In the example of FIG. 8A, the control system 250 is also coupled to the light-generation module 810 and to various components associated with the light-generation module 810.

The light-generation module 810 includes an optical oscillator 812. The optical oscillator 812 generates the output light beam 816. The optical oscillator 812 includes a discharge chamber 815, which encloses a cathode 813-*a* and an anode 813-*b*. The discharge chamber 815 also contains a gaseous gain medium 819. A potential difference between the cathode 813-*a* and the anode 813-*b* forms an electric field in the gaseous gain medium 819. The potential difference may be generated by controlling a voltage source 897 to apply voltage to the cathode 813-*a* and/or the anode 813-*b*. The electric field provides energy to the gain medium 819 sufficient to cause a population inversion and to enable generation of a pulse of light via stimulated emission. Repeated creation of such a potential difference forms a train of pulses, which are emitted as the light beam 816. The repetition rate of the pulsed light beam 816 is determined by the rate at which voltage is applied to the electrodes 813-*a* and 813-*b*.

The gain medium 819 is pumped by applying of a voltage to the electrodes 813-*a* and 813-*b*. The duration and repetition rate of the pulses in the pulsed light beam 816 is determined by the duration and repetition rate of the application of the voltage to the electrodes 813-*a* and 813-*b*. The repetition rate of the pulses may range, for example, between about 500 and 6,000 Hz. In some implementations, the repetition rate may be greater than 6,000 Hz, and may be, for example, 12,000 Hz or greater. Each pulse emitted from the optical oscillator 812 may have a pulse energy of, for example, approximately 1 milliJoule (mJ).

The gaseous gain medium 819 may be any gas suitable for producing a light beam at the wavelength, energy, and bandwidth required for the application. The gaseous gain medium 819 may include more than one type of gas, and the various gases are referred to as gas components. For an excimer source, the gaseous gain medium 819 may contain a noble gas (rare gas) such as, for example, argon or krypton; or a halogen, such as, for example, fluorine or chlorine. In implementations in which a halogen is the gain medium, the gain medium also includes traces of xenon apart from a buffer gas, such as helium.

The gaseous gain medium 819 may be a gain medium that emits light in the deep ultraviolet (DUV) range. DUV light may include wavelengths from, for example, about 100 nanometers (nm) to about 400 nm. Specific examples of the gaseous gain medium 819 include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm.

A resonator is formed between a spectral adjustment apparatus 895 on one side of the discharge chamber 815 and an output coupler 896 on a second side of the discharge chamber 815. The spectral adjustment apparatus 895 may include a diffractive optic such as, for example, a grating and/or a prism, that finely tunes the spectral output of the discharge chamber 815. The diffractive optic may be reflective or refractive. In some implementations (such as shown in FIG. 9A), the spectral adjustment apparatus 895 includes a plurality of diffractive optical elements. For example, the spectral adjustment apparatus 895 may include four prisms, some of which are configured to control a center wavelength of the light beam 816 and others of which are configured to control a spectral bandwidth of the light beam 816.

Referring also to FIG. 9A, a block diagram of a spectral adjustment apparatus 995 is shown. The spectral adjustment apparatus 995 may be used in the light-generation module 810 as the spectral adjustment apparatus 895.

The spectral adjustment apparatus 995 includes a set of optical features or components 921, 922, 923, 924, 925 arranged to optically interact with the light beam 816. The control system 250 is connected to one or more actuation systems 921A, 922A, 923A, 924A, 925A that are physically coupled to respective optical components 921, 922, 923, 924, 925. The actuation systems 921A, 922A, 923A, 924A, 925A may include shafts (such as a shaft 926A) that rotate a component coupled to the shaft about an axis parallel to the shaft. The actuation systems 921A, 922A, 923A, 924A, 925A also include electronics and mechanical devices such as, for example, motors and electronic interfaces for communicating with the control system 250 and for receiving electrical power.

The optical component 921 is a dispersive optical element, for example, a grating or a prism. In the example of FIG. 9A, the optical component 921 is a reflective grating that includes a diffractive surface 902. The optical components 922, 923, 924, and 925 are refractive optical elements and may be, for example, prisms. The optical components 922, 923, 924, and 925 form a beam expander 901 that has an optical magnification OM 965. The OM 965 of the light beam 816 through the beam expander 901 is the ratio of the transverse width Wo of the light beam 816 exiting the beam expander 901 to a transverse width Wi of the light beam 816 entering the beam expander 901.

The surface 902 of the grating 921 is made of a material that reflects and diffracts the wavelengths of the light beam 816. Each of the prisms 922, 923, 924, and 925 is a prism that acts to disperse and redirect the light beam 816 as it passes through the body of the prism. Each of the prisms 922, 923, 924, and 925 is made of a material that transmits the wavelengths in the light beam 816. For example, if the light beam 816 is in the DUV range, the prisms 922, 923, 924, and 925 are made of a material (such as, for example, calcium fluoride) that transmits light in the DUV range.

The prism 925 is positioned farthest from the grating 921, and the prism 922 is positioned closest to the grating 921. The light beam 816 enters the spectral adjustment apparatus through an aperture 955, and then travels through the prism 925, the prism 924, the prism 923, and the prism 922 (in that order). With each passing of the light beam 816 through a consecutive prism 925, 924, 923, 922, the light beam 816 is optically magnified and redirected (refracted at an angle) toward the next optical component. After passing through the prisms 925, 924, 923, and 922, the light beam 816 reflects off the surface 902. The light beam 816 then passes through the prism 922, the prism 923, the prism 924, and the prism 925 (in that order). With each passing through the consecutive prisms 922, 923, 924, 925, the light beam 816 is optically compressed as it travels toward the aperture 955. After passing through the prisms 922, 923, 924, and 925, the light beam 816 exits the spectral adjustment apparatus 995 through the aperture 955. After exiting the spectral adjustment apparatus 995, the light beam 816 passes through the chamber 815 and reflects off of the output coupler 896 to return to the chamber 815 and the spectral adjustment apparatus 995.

The spectral property of the light beam 816 may be adjusted by changing the relative orientations of the optical components 921, 922, 923, 924, and/or 925. Referring to FIG. 9B, the rotation of a prism P (which can be any one of prisms 922, 923, 924, or 925) about an axis that is perpendicular to the plane of the page changes an angle of incidence at which the light beam 816 impinges upon the entrance surface H(P) of that rotated prism P. Moreover, two local optical qualities, namely, an optical magnification OM(P) and a beam refraction angle δ(P), of the light beam 816 through that rotated prism P are functions of the angle of incidence of the light beam 816 impinging upon the entrance surface H(P) of that rotated prism P. The optical magnification OM(P) of the light beam 816 through the prism P is the ratio of a transverse width Wo(P) of the light beam 816A exiting that prism P to a transverse width Wi(P) of the light beam 816 entering that prism P.

A change in the local optical magnification OM(P) of the light beam 816 at one or more of the prisms P within the beam expander 901 causes an overall change in the optical magnification OM 965 of the light beam 816 through the beam expander 901. Additionally, a change in the local beam refraction angle δ(P) through one or more of the prisms P within the beam expander 901 causes an overall change in an angle of incidence 962 (FIG. 9A) of the light beam 816A at the surface 902 of the grating 921. The wavelength of the light beam 816 may be adjusted by changing the angle of incidence 962 (FIG. 9A) at which the light beam 816 impinges upon the surface 902 of the grating 921. The spectral bandwidth of the light beam 816 may be adjusted by changing the optical magnification 965 of the light beam 816.

Accordingly, the spectral properties of the light beam 816 may be changed or adjusted by controlling the orientation of the grating 921 and/or one or more of the prisms 922, 923, 924, 925 via the respective actuators 921A, 922A, 923A, 924A, 925A. The actuators 921A, 922A, 923A, 924A, 925A may be, for example, piezoelectric actuators that change shape in response to the application of voltage. Other implementations of the spectral adjustment apparatus are possible.

Referring again to FIG. 8A, the spectral properties of the light beam 816 may be adjusted in other ways. For example, the spectral properties, such as the spectral bandwidth and center wavelength, of the light beam 816 may be adjusted by controlling a pressure and/or gas concentration of the gaseous gain medium of the chamber 815. For implementations in which the light-generation module 810 is an excimer source, the spectral properties (for example, the spectral bandwidth or the center wavelength) of the light beam 816 may be adjusted by controlling the pressure and/or concentration of, for example, fluorine, chlorine, argon, krypton, xenon, and/or helium in the chamber 815.

The pressure and/or concentration of the gaseous gain medium 819 is controllable with a gas supply system 890. The gas supply system 890 is fluidly coupled to an interior of the discharge chamber 815 via a fluid conduit 889. The fluid conduit 889 is any conduit that is capable of transporting a gas or other fluid with no or minimal loss of the fluid. For example, the fluid conduit 889 may be a pipe that is made of or coated with a material that does not react with the fluid or fluids transported in the fluid conduit 889. The gas supply system 890 includes a chamber 891 that contains and/or is configured to receive a supply of the gas or gasses used in the gain medium 819. The gas supply system 890 also includes devices (such as pumps, valves, and/or fluid switches) that enable the gas supply system 890 to remove gas from or inject gas into the discharge chamber 815. The gas supply system 890 is coupled to the control system 250.

The optical oscillator 812 also includes a spectral analysis apparatus 898. The spectral analysis apparatus 898 is a measurement system that may be used to measure or monitor the wavelength of the light beam 816. In the example shown in FIG. 8A, the spectral analysis apparatus 898 receives light from the output coupler 896. In some implementations, the spectral analysis apparatus 898 is part of the optical measurement apparatus 260.

The light-generation module 810 may include other components and systems. For example, the light-generation module 810 may include a beam preparation system 899. The beam preparation system 899 may include a pulse stretcher that stretches each pulse that interacts with the pulse stretcher in time. The beam preparation system also may include other components that are able to act upon light such as, for example, reflective and/or refractive optical elements (such as, for example, lenses and mirrors), and/or filters. In the example shown, the beam preparation system 899 is positioned in the path of the exposure beam 816. However, the beam preparation system 899 may be placed at other locations within the system 800.

The system 800 also includes the scanner apparatus 880. The scanner apparatus 880 exposes a wafer 882 with a shaped exposure beam 816A. The shaped exposure beam 816A is formed by passing the exposure beam 816 through a projection optical system 881. The scanner apparatus 880 may be a liquid immersion system or a dry system. The scanner apparatus 880 includes a projection optical system 881 through which the exposure beam 816 passes prior to reaching the wafer 882, and a sensor system or metrology system 870. The wafer 882 is held or received on a wafer holder 883. The scanner apparatus 880 also may include, for example, temperature control devices (such as air conditioning devices and/or heating devices), and/or power supplies for the various electrical components.

The metrology system 870 includes a sensor 871. The sensor 871 may be configured to measure a property of the shaped exposure beam 816A such as, for example, bandwidth, energy, pulse duration, and/or wavelength. The sensor 871 may be, for example, a camera or other device that is able to capture an image of the shaped exposure beam 816A at the wafer 882, or an energy detector that is able to capture data that describes the amount of optical energy at the wafer 882 in the x-y plane.

Referring also to FIG. 8B, the projection optical system 881 includes a slit 884, a mask 885, and a projection objective, which includes a lens system 886. The lens system 886 includes one or more optical elements. The exposure beam 816 enters the scanner apparatus 880 and impinges on the slit 884, and at least some of the output light beam 816 passes through the slit 884 to form the shaped exposure beam 816A. In the example of FIGS. 8A and 8B, the slit 884 is rectangular and shapes the exposure beam 816 into an elongated rectangular shaped light beam, which is the shaped exposure beam 816A. The mask 885 includes a pattern that determines which portions of the shaped light beam are transmitted by the mask 885 and which are blocked by the mask 885. Microelectronic features are formed on the wafer 882 by exposing a layer of radiation-sensitive photoresist material on the wafer 882 with the exposure beam 816A. The design of the pattern on the mask is determined by the specific microelectronic circuit features that are desired.

The configuration shown in FIG. 8A is an example of a configuration for a DUV system. Other implementations are possible. For example, the light-generation module 810 may include N instances of the optical oscillator 812, where N is an integer number greater than one. In these implementations, each optical oscillator 812 is configured to emit a respective light beam toward a beam combiner, which forms the exposure beam 816.

FIG. 10 shows another example configuration of a DUV system. FIG. 10 is a block diagram of a photolithography system 1000 that includes a light-generation module 1010 that produces a pulsed light beam 1016, which is provided to the scanner apparatus 880. The photolithography system 1000 also includes the beam separator 117, the optical measurement apparatus 260, and the control system 250. The control system 250 is coupled to the optical measurement apparatus 260, various components of the light-generation module 1010, and the scanner apparatus 1080 to control various operations of the system 1000. In the example of FIG. 10, the beam separator 117 directs a portion of the output light beam 1016 to the optical measurement apparatus 260. Other implementations are possible. For example, the beam separator 117 may be positioned to interact with a seed light beam 1018.

The light-generation module 1010 is a two-stage laser system that includes a master oscillator (MO) 1012_1 that provides the seed light beam 1018 to a power amplifier (PA) 1012_2. The PA 1012_2 receives the seed light beam 1018 from the MO 1012_1 and amplifies the seed light beam 1018 to generate the light beam 1016 for use in the scanner apparatus 880. For example, in some implementations, the MO 1012_1 may emit a pulsed seed light beam, with seed pulse energies of approximately 1 milliJoule (mJ) per pulse, and these seed pulses may be amplified by the PA 1012_2 to about 10 to 15 mJ, but other energies may be used in other examples.

The MO 1012_1 includes a discharge chamber 1015_1 having two elongated electrodes 1013a_1 and 1013b_1, a gain medium 1019_1 that is a gas mixture, and a fan (not shown) for circulating the gas mixture between the electrodes 1013a_1, 1013b_1. A resonator is formed between a line narrowing module 1095 on one side of the discharge chamber 1015_1 and an output coupler 1096 on a second side of the discharge chamber 1015_1.

The discharge chamber 1015_1 includes a first chamber window 1063_1 and a second chamber window 1064_1. The first and second chamber windows 1063_1 and 1064_1 are on opposite sides of the discharge chamber 1015_1. The first and second chamber windows 1063_1 and 1064_1 transmit light in the DUV range and allow DUV light to enter and exit the discharge chamber 1015_1.

The line narrowing module 1095 may include a diffractive optic such as a grating that finely tunes the spectral output of the discharge chamber 1015_1. The light-generation module 1010 also includes a line center analysis module 1068 that receives an output light beam from the output coupler 1096 and a beam coupling optical system 1069. The line center analysis module 1068 is a measurement system that may be used to measure or monitor the wavelength of the seed light beam 1018. The line center analysis module 1068 may be placed at other locations in the light-generation module 1010, or it may be placed at the output of the light-generation module 1010.

The gas mixture that is the gain medium 1019_1 may be any gas suitable for producing a light beam at the wavelength and bandwidth required for the application. For an excimer source, the gas mixture may contain a noble gas (rare gas) such as, for example, argon or krypton, a halogen, such as, for example, fluorine or chlorine and traces of xenon apart from a buffer gas, such as helium. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. Thus, the light beams 1016 and 1018 include wavelengths in the DUV range in this implementation. The excimer gain medium (the gas mixture) is pumped with short (for example, nanosecond) current pulses in a high-voltage electric discharge by application of a voltage to the elongated electrodes 1013a_1, 1013b_1.

The PA 1012_2 includes a beam coupling optical system 1069 that receives the seed light beam 1018 from the MO 1012_1 and directs the seed light beam 1018 through a discharge chamber 1015_2, and to a beam turning optical element 1092, which modifies or changes the direction of the seed light beam 1018 so that it is sent back into the discharge chamber 1015_2. The beam turning optical element 1092 and the beam coupling optical system 1069 form a circulating and closed loop optical path in which the input into a ring amplifier intersects the output of the ring amplifier at the beam coupling optical system 1069.

The discharge chamber 1015_2 includes a pair of elongated electrodes 1013a_2, 1013b_2, a gain medium 1019_2, and a fan (not shown) for circulating the gain medium 1019_2 between the electrodes 1013a_2, 1013b_2. The gas mixture that forms the gain medium 1019_2 may be the same as the gas mixture that forms gain medium 1019_1.

The discharge chamber 1015_2 includes a first chamber window 1063_2 and a second chamber window 1064_2. The first and second chamber windows 1063_2 and 1064_2 are on opposite sides of the discharge chamber 1015_2. The first and second chamber windows 1063_2 and 1064_2 transmit light in the DUV range and allow DUV light to enter and exit the discharge chamber 1015_2.

When the gain medium 1019_1 or 1019_2 is pumped by applying voltage to the electrodes 1013a_1, 1013b_1 or 1013a_2, 1013b_2, respectively, the gain medium 1019_1 and/or 1019_2 emits light. When voltage is applied to the electrodes at regular temporal intervals, the light beam 1016 is pulsed. Thus, the repetition rate of the pulsed light beam 1016 is determined by the rate at which voltage is applied to the electrodes. The repetition rate of the pulses may range between about 500 and 6,000 Hz for various applications. In some implementations, the repetition rate may be greater than 6,000 Hz, and may be, for example, 12,000 Hz or greater, but other repetition rates may be used in other implementations.

The output light beam 1016 may be directed through a beam preparation system 1099 prior to reaching the scanner apparatus 880. The beam preparation system 1099 may include a bandwidth analysis module that measures various parameters (such as the bandwidth or the wavelength) of the beam 1016. The beam preparation system 1099 also may include a pulse stretcher that stretches each pulse of the output light beam 1016 in time. The beam preparation system 1099 also may include other components that are able to act upon the beam 1016 such as, for example, reflective and/or refractive optical elements (such as, for example, lenses and mirrors), filters, and optical apertures (including automated shutters).

The DUV light-generation module 1010 also includes the gas management system 1090, which is in fluid communication with an interior 1078 of the DUV light-generation module 1010.

Other aspects of the invention are set out in the following numbered clauses.

1. An optical measurement apparatus for a light source, the optical measurement apparatus comprising:
    an etalon comprising a focusing lens configured to focus light at an image plane, wherein the etalon is associated with a calibration parameter related to the focusing lens, and the calibration parameter has a pre-set default value;
    an optical detector configured to detect an interference pattern produced by the etalon and to produce information related to the etalon, the information comprising first spatial information for a first fringe and second spatial information for a second fringe; and
    a control system coupled to the optical detector, the control system configured to:
    determine a measurement error value of the etalon based on first spatial information from the detector, the second spatial information, and an initial value of the calibration parameter; and
    analyze the measurement error value to determine whether to adjust the pre-set default value.

2. The optical measurement apparatus of clause 1, wherein the light source comprises a deep ultraviolet (DUV) light source.

3. A light source comprising:
    a light-generation apparatus; and
    an optical measurement apparatus comprising:
    an etalon comprising a focusing lens configured to focus light at an image plane, the etalon associated with a calibration parameter related to the focusing lens, and the calibration parameter having a pre-set default value;
    an optical detector configured to detect an interference pattern produced by the etalon and to produce information related to the etalon, the information comprising first spatial information for a first fringe and second spatial information for a second fringe; and
    a control system coupled to the optical detector, the control system configured to:
    determine a measurement error value of the etalon based on the first spatial information, the second spatial information, and an initial value of the calibration parameter; and
    analyze the measurement error value to determine whether to adjust the pre-set default value.

4. The light source of clause 3, wherein the light-generation apparatus comprises a deep ultraviolet (DUV) light source.

5. The light source of clause 4, wherein the light-generation apparatus comprises a master oscillator.

6. The light source of clause 4, wherein the light generation apparatus further comprises a power amplifier.

7. The light source of clause 4, wherein the light-generation apparatus comprises a plurality of master-oscillators.

8. The light source of clause 3, further comprising an optical element configured to receive light from the light-generation apparatus and to direct light to the etalon.

9. The light source of clause 8, wherein the optical element is a dispersive optical element.

10. A method comprising:
    accessing information relating to an etalon, wherein the etalon is associated with a calibration parameter having a pre-set default value, the etalon is configured to produce an interference pattern comprising a plurality of fringes from a received light beam, and the information relating to the etalon comprises first spatial information related to a first fringe of the plurality of fringes and second spatial information related to a second fringe of the plurality of fringes;
    determining a first wavelength value of the received light beam based on the spatial information related to the first fringe and an initial value of the calibration parameter;
    determining a second wavelength value of the received light beam based on the spatial information related to the second fringe and the initial value of the calibration parameter; and
    comparing the first wavelength value and the second wavelength value to determine a measurement error value.

11. The method of clause 10, further comprising determining whether to adjust the pre-set default value of the calibration parameter based on the measurement error value.

12. The method of clause 11, wherein the measurement error value comprises a difference between the first wavelength value and the second wavelength value, and pre-set default value is adjusted to a value that causes a magnitude of the measurement error value to be less than a threshold.

13. The method of clause 12, wherein the pre-set default value is adjusted to a value that causes the measurement error value to be zero.

14. The method of clause 10, wherein the calibration parameter comprises a focal length of a lens at an output of the etalon, and the measurement error comprises a difference between the first wavelength value and the second wavelength value.

15. The method of clause 10, wherein the first spatial information comprises a diameter of the first fringe, and the second spatial information comprises a diameter of the second fringe.

16. The method of clause 10, further comprising directing a light beam toward the etalon; and wherein the first fringe is produced by a first portion of the light beam, and the second fringe is produced by a second portion of the light beam.

17. The method of clause 16, wherein the light beam comprises a plurality of pulses, and the first portion of the light beam comprises a first one of the plurality of pulses, and the second portion of the light beam comprises a second one of the plurality of pulses.

18. The method of clause 16, wherein the light beam comprises a continuous-wave light beam, and the first portion of the light beam comprises a first sample of the light beam, and the second portion of the light beam comprises a second sample of the light beam.

19. The method of clause 16, further comprising:
changing the initial value of the calibration parameter to an updated value of the calibration parameter;
actuating an optical element to thereby change the wavelength of the received light beam;
determining a first wavelength value of the received light beam based on the spatial information related to the first fringe and the updated value of the calibration parameter;
determining a second wavelength value of the received light beam based on the spatial information related to the second fringe and the updated value of the calibration parameter; and
comparing the first wavelength value and the second wavelength value to determine a measurement error value based on the updated value of the calibration parameter.

20. The method of clause 19, wherein the optical element is actuated to increase the wavelength or to decrease the wavelength prior to determining the second wavelength value.

21. The method of clause 19, wherein the first wavelength value and the second wavelength value are determined more than once each time the optical element is actuated.

22. The method of clause 20, further comprising determining whether to adjust the pre-set default value of the calibration parameter by comparing the error measurement value determined based on the initial value of the calibration parameter and the error measurement value determined based on the updated value of the calibration parameter.

23. The method of clause 10, wherein the initial value of the calibration parameter is the pre-set default value.

24. The method of clause 10, wherein the first fringe and the second fringe are in the interference pattern at the same time.

25. A method for calibrating an etalon, the method comprising:
accessing information relating to an etalon, wherein the etalon is associated with a calibration parameter having a pre-set default value, the etalon is configured to produce an interference pattern comprising a plurality of fringes from a received light beam, and the information relating to the etalon comprises first spatial information related to a first fringe of the plurality of fringes and second spatial information related to a second fringe of the plurality of fringes;
determining a measurement error value of the etalon based on the first spatial information, the second spatial information, and an initial value of the calibration parameter; and
analyzing the measurement error value to determine whether to adjust the pre-set default value.

26. The method of clause 25, wherein the calibration parameter comprises a focal length of a lens at an output of the etalon.

27. The method of clause 26, further comprising:
determining a first wavelength value based on the first spatial information; and
determining a second wavelength value based on the second spatial information, wherein the measurement error comprises a difference between the first wavelength value and the second wavelength value.

28. The method of clause 25, wherein
the calibration parameter comprises a plurality of initial values;
determining a measurement error value comprises simulating a plurality of measurement error values for each of the plurality of initial values, each measurement error value being based on the first spatial information, the second spatial information, and one of the plurality of initial values of the calibration parameter; and
analyzing the measurement error values comprises analyzing the simulated measurement error values.

Other implementations are within the scope of the claims.

The invention claimed is:
1. An optical measurement apparatus for alight source, the optical measurement apparatus comprising:
an etalon comprising a focusing lens configured to focus light at an image plane, wherein the etalon is associated with a calibration parameter related to the focusing lens, and the calibration parameter has a pre-set default value;
an optical detector configured to detect an interference pattern produced by the etalon and to produce information related to the etalon, the information comprising first spatial information for a first fringe and second spatial information for a second fringe; and
a control system coupled to the optical detector, the control system configured to:
determine a measurement error value of the etalon based on first spatial information from the detector, the second spatial information, and an initial value of the calibration parameter; and
analyze the measurement error value to determine whether to adjust the pre-set default value.

2. The optical measurement apparatus of claim 1, wherein the light source comprises a deep ultraviolet (DUV) light source.

3. A light source comprising:
a light-generation apparatus; and
an optical measurement apparatus comprising:
an etalon comprising a focusing lens configured to focus light at an image plane, the etalon associated with a calibration parameter related to the focusing lens, and the calibration parameter having a pre-set default value;
an optical detector configured to detect an interference pattern produced by the etalon and to produce information related to the etalon, the information comprising first spatial information for a first fringe and second spatial information for a second fringe; and
a control system coupled to the optical detector, the control system configured to:
determine a measurement error value of the etalon based on the first spatial information, the second spatial information, and an initial value of the calibration parameter; and
analyze the measurement error value to determine whether to adjust the pre-set default value.

4. The light source of claim 3, wherein the light-generation apparatus comprises a deep ultraviolet (DUV) light source.

5. The light source of claim 4, wherein the light-generation apparatus comprises a master oscillator.

6. The light source of claim 4, wherein the light-generation apparatus further comprises a power amplifier.

7. The light source of claim 4, wherein the light-generation apparatus comprises a plurality of master-oscillators.

8. The light source of claim 3, further comprising an optical element configured to receive light from the light-generation apparatus and to direct light to the etalon.

9. The light source of claim 8, wherein the optical element is a dispersive optical element.

10. A method of monitoring a calibration parameter of an etalon during use of the etalon, the method comprising:
receiving data from a detector positioned to sense an interference pattern produced by an etalon that receives a light beam, wherein the interference pattern comprises a plurality of fringes based on the received light beam, and the data comprises first spatial information related to a first fringe of the plurality of fringes and second spatial information related to a second fringe of the plurality of fringes;
accessing a calibration parameter associated with the etalon, the calibration parameter having a pre-set default value;
determining a first wavelength value of the received light beam based on the first spatial information related to the first fringe and an initial value of the calibration parameter;
determining a second wavelength value of the received light beam based on the second spatial information related to the second fringe and the initial value of the calibration parameter;
comparing the first wavelength value and the second wavelength value to determine a measurement error value; and
determining, during use of the etalon, whether to adjust the pre-set default value of the calibration parameter based on the measurement error value.

11. The method of claim 10, wherein the measurement error value comprises a difference between the first wavelength value and the second wavelength value, and the pre-set default value is adjusted to a value that causes a magnitude of the measurement error value to be less than a threshold.

12. The method of claim 11, wherein the pre-set default value is adjusted to a value that causes the measurement error value to be zero.

13. The method of claim 10, wherein the calibration parameter comprises a focal length of a lens at an output of the etalon, and the measurement error comprises a difference between the first wavelength value and the second wavelength value.

14. The method of claim 10, wherein the first spatial information comprises a diameter of the first fringe, and the second spatial information comprises a diameter of the second fringe.

15. The method of claim 10, further comprising directing a light beam toward the etalon; and wherein the first fringe is produced by a first portion of the light beam, and the second fringe is produced by a second portion of the light beam.

16. The method of claim 15, wherein the light beam comprises a plurality of pulses, and the first portion of the light beam comprises a first one of the plurality of pulses, and the second portion of the light beam comprises a second one of the plurality of pulses.

17. The method of claim 15, wherein the light beam comprises a continuous-wave light beam, and the first portion of the light beam comprises a first sample of the light beam, and the second portion of the light beam comprises a second sample of the light beam.

18. The method of claim 15, further comprising:
changing the initial value of the calibration parameter to an updated value of the calibration parameter;
actuating an optical element to thereby change the wavelength of the received light beam;
determining a first wavelength value of the received light beam based on the spatial information related to the first fringe and the updated value of the calibration parameter;
determining a second wavelength value of the received light beam based on the spatial information related to the second fringe and the updated value of the calibration parameter; and
comparing the first wavelength value and the second wavelength value to determine a measurement error value based on the updated value of the calibration parameter.

19. The method of claim 18, wherein the optical element is actuated to increase the wavelength or to decrease the wavelength prior to determining the second wavelength value.

20. The method of claim 19, wherein determining whether to adjust the pre-set default value of the calibration parameter comprises comparing the error measurement value determined based on the initial value of the calibration parameter and the error measurement value determined based on the updated value of the calibration parameter.

21. The method of claim 18, wherein the first wavelength value and the second wavelength value are determined more than once each time the optical element is actuated.

22. The method of claim 10, wherein the initial value of the calibration parameter is the pre-set default value.

23. The method of claim 10, wherein the first fringe and the second fringe are in the interference pattern at the same time.

24. The method of claim 10, further comprising: directing a light beam toward an etalon, and wherein the first fringe is produced by a first portion of the light beam, and the second fringe is produced by a second portion of the light beam;
changing the initial value of the calibration parameter to an updated value of the calibration parameter;
actuating an optical element to thereby change the wavelength of the received light beam.

25. A method for calibrating an etalon during use of the etalon, the method comprising:
receiving data from a detector positioned to sense an interference pattern produced by an etalon that receives a light beam, wherein the interference pattern comprises a plurality of fringes based on the received light beam, and the data comprising first spatial information related to a first of the plurality of fringes and second spatial information related to a second fringe of the plurality of fringes;
accessing a calibration parameter having a pre-set default value;
determining a measurement error value of the etalon based on the first spatial information, the second spatial information, and an initial value of the calibration parameter; and
analyzing the measurement error value to determine whether to adjust the pre-set default value of the calibration parameter during use of the etalon.

26. The method of claim 25, wherein the calibration parameter comprises a focal length of a lens at an output of the etalon.

27. The method of claim 26, further comprising:
determining a first wavelength value based on the first spatial information; and
determining a second wavelength value based on the second spatial information, wherein the measurement error comprises a difference between the first wavelength value and the second wavelength value.

28. The method of claim 25, wherein
the calibration parameter comprises a plurality of initial values;
determining a measurement error value comprises simulating a plurality of measurement error values for each of the plurality of initial values, each measurement error value being based on the first spatial information, the second spatial information, and one of the plurality of initial values of the calibration parameter; and
analyzing the measurement error values comprises analyzing the simulated measurement error values.

29. The method of claim 25, further comprising:
directing a light beam toward an etalon, and wherein the first fringe is produced by a first portion of the light beam, and the second fringe is produced by a second portion of the light beam;
changing the initial value of the calibration parameter to an updated value of the calibration parameter;
actuating an optical element to thereby change the wavelength of the received light beam.

* * * * *